United States Patent [19]

Hoo

[11] Patent Number: 4,875,867

[45] Date of Patent: Oct. 24, 1989

[54] EXTENSION HANDLE FOR A CIRCUIT BOARD INJECTOR/EJECTOR MECHANISM

[75] Inventor: Kee K. Hoo, Vancouver, Wash.

[73] Assignee: Tektronix, Inc., Beaverton, Oreg.

[21] Appl. No.: 302,841

[22] Filed: Jan. 26, 1989

[51] Int. Cl.⁴ .......................................... H01R 13/62
[52] U.S. Cl. ................................. 439/157; 439/160; 361/399; 361/415
[58] Field of Search ..................... 439/152–160, 439/372, 59; 361/399, 413–415

[56] References Cited

U.S. PATENT DOCUMENTS

| | | | |
|---|---|---|---|
| 3,311,863 | 3/1967 | Beale | 439/155 |
| 4,197,572 | 4/1980 | Aimar | 439/160 |
| 4,564,250 | 1/1986 | Klein et al. | 361/412 |
| 4,602,835 | 7/1986 | Bauer et al. | 439/160 |
| 4,603,375 | 7/1986 | Miller et al. | 439/59 |
| 4,648,009 | 3/1987 | Beun et al. | 439/160 |
| 4,699,594 | 10/1987 | Assel et al. | 439/152 |
| 4,783,720 | 11/1988 | Joist et al. | 361/399 |

Primary Examiner—David Pirlot
Attorney, Agent, or Firm—Willaim K. Bucher

[57] ABSTRACT

An injector/ejector mechanism for urging a circuit board plug-in module into and out of a card cage mainframe has a bearing member for transferring rotational pressure from a handle to the mainframe for seating and unseating the plug-in in the mainframe. The handle is extendable to provide additional mechanical advantage at the bearing end of the mechanism.

18 Claims, 4 Drawing Sheets

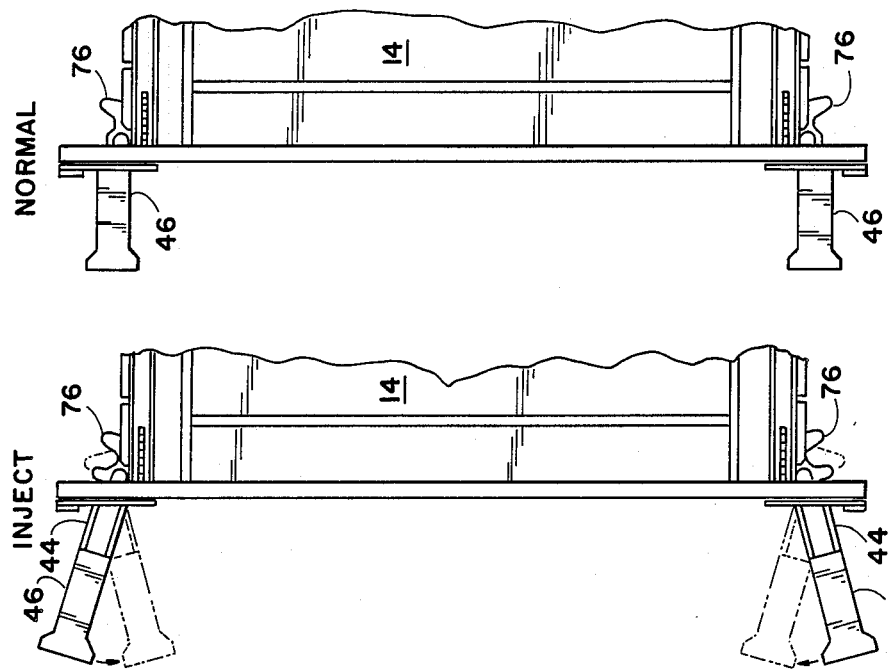
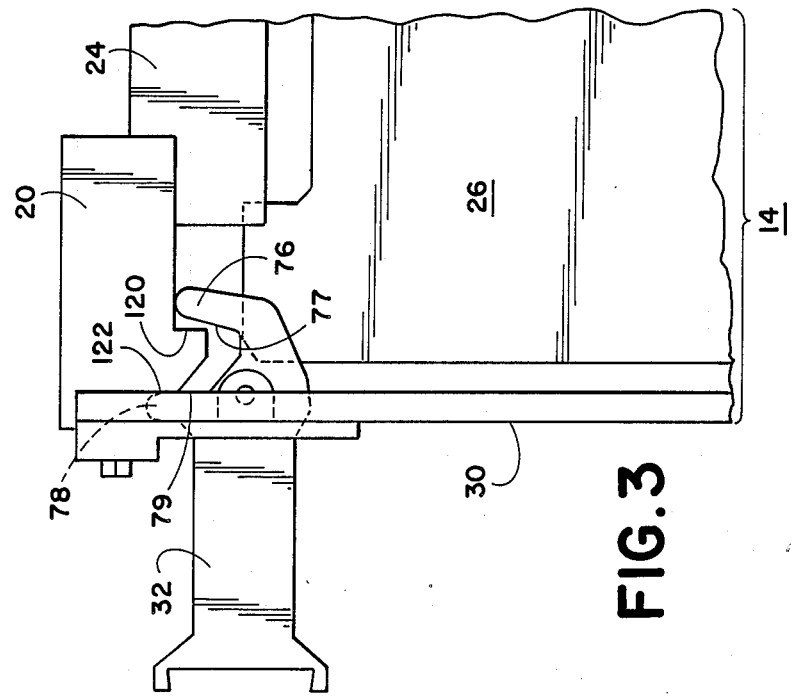

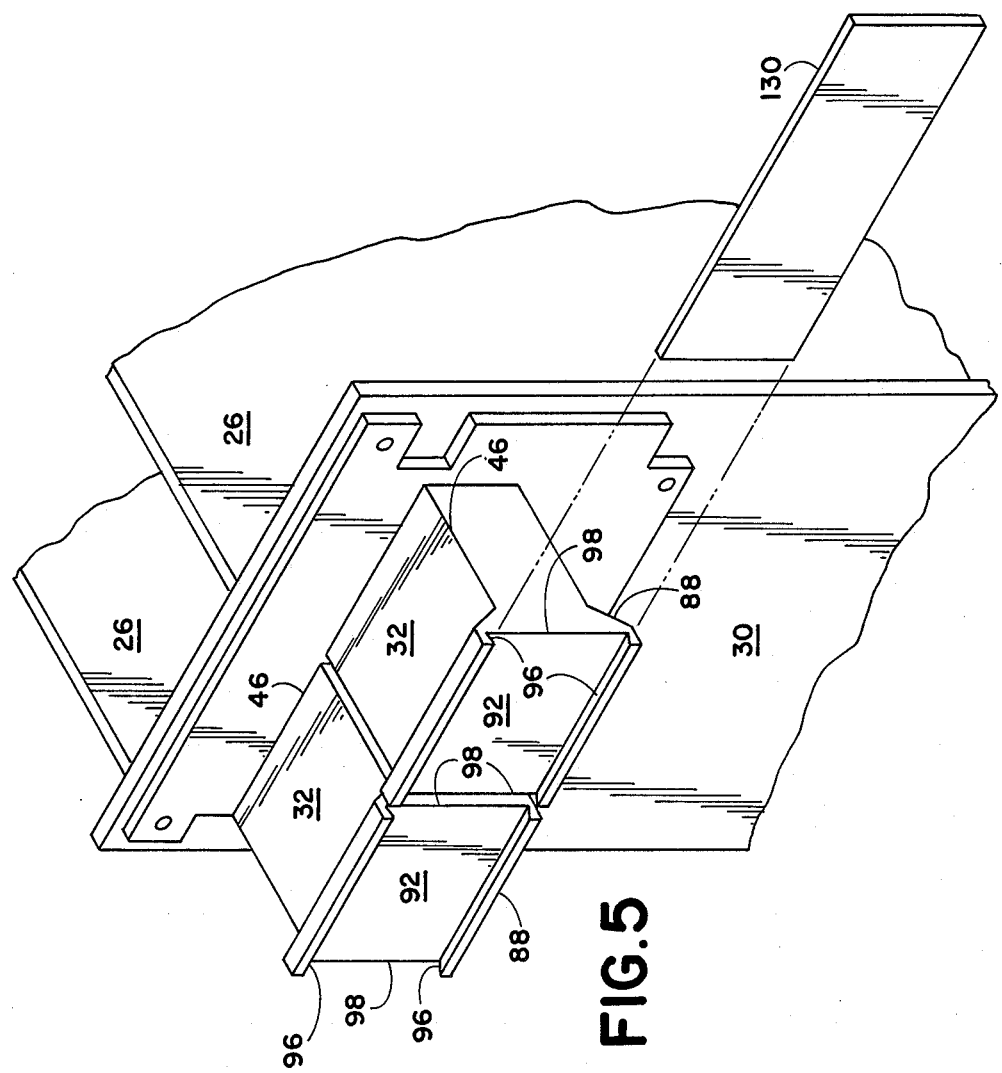

EXTENSION HANDLE FOR A CIRCUIT BOARD INJECTOR/EJECTOR MECHANISM

BACKGROUND OF THE INVENTION

The present invention relates to injector/ejector mechanisms for circuit board modules and more specifically to a handle assembly for increasing the mechanical advantage of such mechanisms.

In recent years, open system architectures have been developed to provide mechanical and electrical compatibility between products of many different vendors. The VMEbus (IEEE Standard 1014) is an example of one such open system architecture. The VMEbus uses the "Eurocard" printed circuit board standard (IEC 297-3) to define the dimensions of VMEbus circuit board plug-in modules. These modules are mounted in a card cage mainframe that provides electrical power and interconnectivity through a backplane. Up to twenty modules can be installed in a standard mainframe having module guide rails spaced 0.8 inches apart.

The VMEbus modules are approximately six inches deep and four or nine inches high. Each module includes an appropriate size circuit board having a front panel mounted thereto. Handles are mounted on the front panel to aid in inserting and removing the modules from the mainframe. The smaller of the two modules has a single 96 pin electrical connector on the end opposite the front panel while the larger one has two connectors. The modules are generally installed vertically in the mainframe and connect with coextensive electrical connectors mounted on the backplane of the mainframe.

Attempts have been made to facilitate the insertion and removable of VMEbus modules into and out of the mainframe. U.S. Pat. No. 4,603,375, assigned to Zero Corp., describes a handle that is mounted on the front panel of a VMEbus module. The handle pivots bringing an ejecting surface formed on the handle into contact with mainframe front rail. Applying pressure to the handle causes the disengagement of the 96 pin electrical connectors from the coextensive connectors on the backplane.

A similar type of handle is manufactured by Elma Electronic Inc. of Fremont, California that has both an ejecting surface and an injecting surface. Pivoting the handle and applying pressure in one direction causes the injecting surface to engage the front panel rail to force the 96 pin connectors into the coextensive backplane connectors. Pivoting the handle and applying pressure in the opposite direction causes the ejecting surface to contact the front rail to disengage the the 96 pin connectors from the backplane connectors.

Based on the VMEbus architecture, a consortium of instrument manufactures developed the VXIbus (VMEbus Extensions for Instrumentation) architecture. The VXIbus maintains the mechanical and electrical standards of the VMEbus while adding and defining a third 96 pin connector requiring the addition of two new module sizes. These modules are approximately thirteen inches deep and nine and fourteen inches high and are placed on 1.2 inch centers. The addition of a third 96 pin connector in VXIbus modules increases the pressure required to insert and remove the modules. Prior art injecting/ejecting mechanisms do not have the mechanical leverage necessary to easily engage or disengage the electrical connectors in the larger size modules of the VXIbus architecture. In addition, the narrow width of the modules in conjunction with close packed spacing between the modules along with the precise placement of the front panel handles dictated by both the VMEbus and the VXIbus architectures makes it difficult for a user to grasp and apply pressure to the handles. Frequently, the user is injured attempting to insert or remove a module from the mainframe.

What is needed is a injector/ejector mechanism for use in VMEbus and VXIbus environment that provides greater mechanical advantage than prior art mechanisms while at the same time providing the user with an easy means of grasping and applying pressure to the mechanism.

SUMMARY OF THE INVENTION

Accordingly, the present invention provides an injector/ejector mechanism with additional mechanical advantage for urging a circuit board plug-in module into and out of a card cage mainframe. A first handle segment is rotatably connected to a front panel of the plug-in module. The first handle segment has a bearing end and a passage, such as a channel, formed within the segment and extending outwardly from the front panel opposite the bearing end. Slidably mating with the first handle segment is a second handle segment having a gripping member and an extension member with the extension member mating with the passage in the first handle segment. Pulling on the second handle segment extends the total length of the injector/ejector mechanism handle providing additional mechanical advantage at the bearing end of the first handle segment when pressure is applied about the rotation axis of the injector/ejector mechanism.

The objects, advantages and novel features of the present invention are apparent from the following detailed description when read in conjunction with the appended claims and attached drawings.

BRIEF DESCRIPTION OF THE DRAWINGS

FIG. 3 is a side view of the injector/ejector mechanism of the present invention mounted on a plug-in module installed in a card cage mainframe.

FIG. 4A and 4B show the operation of the injector/ejector mechanism of the present invention.

FIG. 5 shows the ganging of two injector/ejector mechanisms of the present invention.

DESCRIPTION OF THE PREFERRED EMBODIMENT

Figure 1:
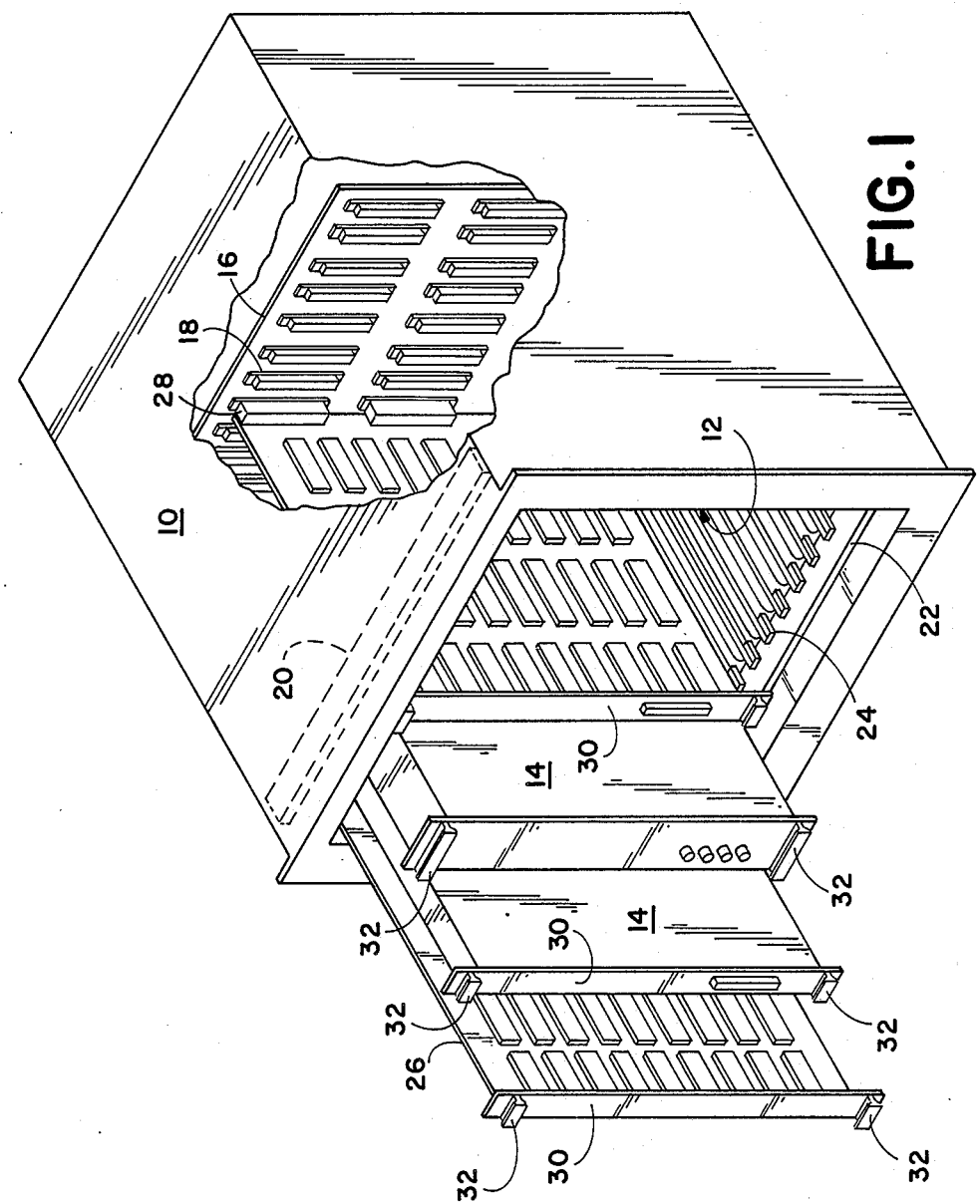
FIG. 1 shows a card cage mainframe with circuit board plug-in modules having the injector/ejector mechanism of the present invention.

Referring to FIG. 1, there is shown a card cage mainframe 10 having a frontal opening 12 into which are inserted circuit board plug-in modules 14. Mounted rearward of the frontal opening 12 is a backplane 16 having a matrix of electrical connectors 18 mounted thereon. Affixed adjacent to the frontal opening 12 are top and bottom rails, respectively numbered 20 and 22. Extending from the top and bottom rails, 20 and 22, to the backplane 16 are a plurality of plug-in module rails 24, which are substantially normal to the rails 20 and 22 and the backplane 16. In the VXIbus architecture, rails 24 are spaced on 1.2 inch centers whereas the rails 24 are spaced on 0.8 inch centers in the VMEbus architecture.

Each circuit board plug-in module 14 is made of a circuit board assembly 26 having electrical connectors 28 mounted thereon. Connectors 28 mate with the coextensive electrical connectors 18 of the backplane 16. A front panel 30 is mounted to the circuit board assembly 26 opposite the end having the electrical connectors 28. Positioned adjacent to the ends of the front panel 30 are handles 32. In the preferred embodiment of the present invention, handles 32 are injector/ejector mechanisms for urging the circuit board plug-in module 14 into and out of the card cage mainframe 10. The circuit board plug-in module is inserted and aligned in the mainframe 10 by engagement with rails 24. Continued insertion of the plug-in module 14 into the mainframe 10 mates the electrical connectors 28 with 18. Plug-in module 14 is seated in the mainframe 10 when the front panel 30 is juxtaposed against the top and bottom rails 20 and 22.

Figure 2:
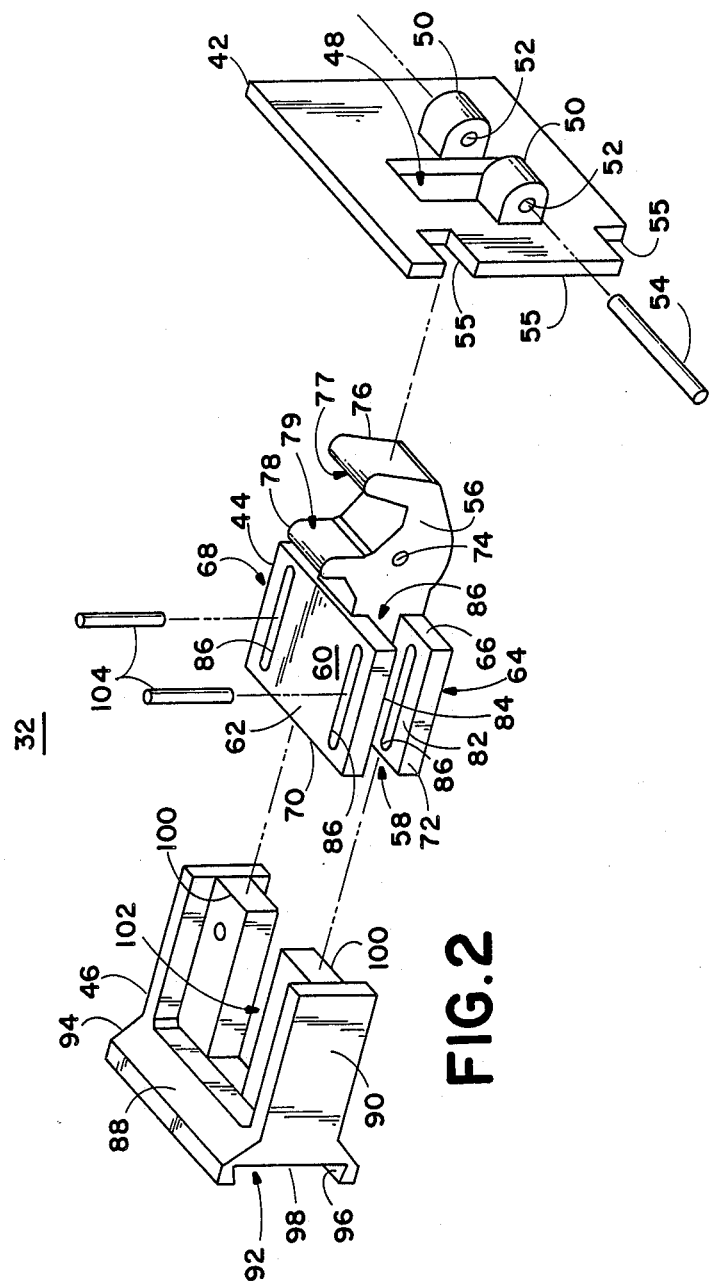
FIG. 2 is an exploded perspective view of the injector/ejector mechanism of the present invention.

Referring to FIG. 2, there is shown an exploded perspective view of the injector/ejector mechanism 32 of the present invention having a keying plate 42, first handle segment 44, and a second handle segment 46. In the preferred embodiment, the elements of the injector/ejector mechanism are injected molded part having a composition of polycarbonate with a 20% glass fill. The keying plate 42 has a central aperture 48 through which a portion of the first handle segment 44 is inserted. On the surface of the keying plate 42 opposite the first handle segment 44 are integrally formed protrusions 50 having aperture 52 formed therein defining an axis of rotation for the injector/ejector mechanism 32. An axial pin 54 secures the first handle segment 44 to the keying plate 42. Keying slots and protrusion 55 are formed on the periphery of the keying plate 42 to act as lockouts to prevent the insertion of non-compatible circuit board plug-in modules 14 next to each other. The keying plate is mounted on the front panel 30 of a circuit board plug-in module 14 with appropriate securing means.

The first handle segment 44 is rotatably connected to the keying plate by axial pin 54. The first handle segment 44 has a bearing end 56 and passages 58 formed within the segment 44 extending outwardly from the keying plate 42 and hence from the front panel 30 of the circuit board plug-in module 14 opposite the bearing end 56. In the preferred embodiment, the first handle segment 44 has a rectilinear body 60 with top, bottom, and side surfaces, respectively numbered 62, 64, 66, 68, 70 and 72. Bearing end 56 is integrally formed with side surface 66 and has an aperture 74 formed there through for accepting axial pin 54. Injector and ejector lever arms 76 and 78 are formed on the bearing end 56. Injector lever arm has a injector surface 77 and ejector lever arm 78 has a ejector surface 79 for engaging coextensive injector and ejector surfaces on the card cage mainframe 10 during rotational movement of the injector/ejector mechanism 32.

Passages 58 are formed as channels in the sides surfaces 68 and 72 of the rectilinear body 60. The channel passages 58 each have a top and bottom walls, respectively numbered 80 and 82, and an inner sidewall 84. Interior guide means 86, such as slots, grooves, or the like, are formed in the top and bottom walls, 80 and 82, to limit the movement of the second handle segment 46 with respect to the first handle segment 44.

The second handle segment 46 has a gripping member 88 and extension members 90 integrally formed with and perpendicular to the gripping member 88. The extension members 90 slidably mate with the channel passages 58 in the first handle segment 44. The gripping member has a rectangular planar surface 92 with angularly depending sides 94 extending from the extension members 90 to the planar surface 92. Grooved sidewalls 96 are formed adjacent to the periphery on opposing sides of the planar surface 92 forming a depression having open ends 98 in the grabbing member 88. The grooved sidewalls 96 provide a means for ganging multiple injector/ejector mechanisms together, which will be discussed in greater detail below.

The extension member 90 has opposing shouldered sidewalls 100 with a slot 102 formed there between. A retaining pin 104 is affixed to the shoulder in each of the shouldered sidewalls 100, which engage the interior guide means 86, in the form of slots, in the first handle segment 44.

The operation of the injector/ejector mechanism of the present invention will be discussed with respect to FIGS. 3, 4A and 4B. FIG. 3 is a side view showing a circuit board plug-in module 14 mounted in a card cage mainframe 10. The front panel 30 on the plug-in module 14 is in contact with the top rail 20 of the mainframe 10 and the injector/ejector mechanism 32 is normal to the front panel 30. A portion of the circuit board assembly 26 is engaged in the plug-in module rail 24. Rail 24 is connected to the top rail 20 that has an injector surface 120 and an ejector surface 122. The injector surface 77 of injector lever arm 76 and the ejector surface 79 of ejector arm 78 respectively engage surfaces 120 and 122 during rotational movement of the injector/ejector mechanism 32. A mirror image of the above described structure is associated with the bottom rail 22 on the mainframe 10.

FIG. 4A shows a circuit board plug-in module 14 ready for insertion into a card cage mainframe 10. For simplicity of the drawing, the mainframe has been omitted from the drawing. The second handle segment 46 is extended from the first handle segment 44 exposing a portion of the shouldered sidewalls of the second handle segment 46 outside the channel passages of the first handle segments 44. The movement of the second handle segment 46 is limited by the retaining pins 104 in shoulders 100 engaging the ends of slots 86 in the first handle segment. The injector/ejector mechanism 32 is rotated allowing the injector lever arm 76 to pass by the injector surface 120 on the top rail 20. The plug-in module 14 is inserted into the mainframe 10 to where the injector arm lever 76 is past the injector surface 120 and the electrical connectors 28 in the back of the circuit board assembly 26 are partially connected in the coextensive electrical connectors 18 on the backplane 16. The injector/ejector mechanism 32 is rotated in the direction opposite the previous rotation direction to engage injector surface 77 against surface 120. Continued pressure on the gripping member 88 of the injector/ejector mechanism 32 produces the necessary 40.46 lbf. to 60.69 lbf on the injector surfaces 77 and 120 to seat electrical connectors 28 into connectors 18. The injector/ejector mechanism is placed in a position normal to the front panel and the second handle segment 46 is retracted into the first handle segment 44 as is shown in FIG. 4B. To extract the plug-in module 14 from the mainframe 10, the second handle segment 46 is extended with respect to the first handle segment 44 and the injector/ejector mechanism 32 is rotated until the ejector surface 79 comes in contact with ejector surface 122. Continued pressure on the gripping member 88 disengages the electrical connectors 28 from 18. The extender handle used in the injector/ejector mechanism of the present invention provides a mechanical advantage for placing greater pressure on the injector and ejector surfaces of the injector/ejector mechanism without requiring the user to apply greater pressure on the mechanism handle. It is difficult with the prior art injector/ejector mechanisms to apply the required amount of pressure to seat and unseat the electrical connectors of a VXIbus module without subjecting the user to potential injury due to the greater handle pressure necessary to seat and unseat the modules.

Referring to FIG. 5., there are shown two injector/ejector mechanisms 32 rotatably connected to a front panel 30 designed for plug-in modules having two circuit board assemblies 26. Cooperative rotational movement of the injector/ejector mechanisms 32 is achieved by inserting a connector plate 130 is inserted into the open end 98 of the depression on the gripping member 88 and engages the grooved sidewalls 96. Continued insertion of the connector plate 130 engages both injector/ejector mechanisms 32 via the grooved sidewalls 96. Once ganged together, the injector/ejector mechanisms 32 function as one unit.

An injector/ejector mechanism has been disclosed wherein additional mechanical advantage is exerted on a bearing member for urging a circuit board plug-in module into and out of a card cage mainframe by providing the injector/ejector mechanism with an extendable handle allowing a user to exert a greater amount of pressure on the bearing end without exerting more presure on the handle. These and other aspects of the present invention are set forth in the appended claims.

I claim:

1. An injector/ejector mechanism for urging a circuit board plug-in module into and out of a card cage mainframe comprising:
    a first handle segment rotatably connected to a front panel of the plug-in module, the first handle segment having a bearing end and a passage formed within the segment and extending outwardly from the front panel opposite the bearing end; and
    a second handle segment having a gripping member normal to an extension member, the extension member slidably mating with the passage in the first handle segment, the second handle segment movable with respect to the first handle segment from a first position wherein the extension member is within the passage to a second position wherein a portion of the extension member is exposed outside the passage providing additional mechanical advantage at the bearing end when pressure is applied to the gripping member for urging the circuit board module into and out of the mainframe during rotation of the injector/ejector mechanism.

2. The injector/ejector mechanism of claim 1 further comprising a keying plate connected to the front panel of the plug-in module and having a central aperture through which the bearing end of the first handle member pass, integrally formed protrusions having apertures defining a rotational axis for the injector/ejector mechanism, and integrally formed projections and slots on the periphery of the plate defining keys for proper placement of compatible plug-in modules.

3. The injector/ejector mechanism of claim 1 wherein the first handle segment further comprises a rectilinear body having top, bottom and side surfaces with the bearing end integrally formed on and extending away from one of the side surfaces and passages formed on the side surfaces normal to the surface having the bearing end.

4. The injector/ejector mechanism of claim 3 wherein each passage on the side surfaces of the rectilinear body comprises a channel having top and bottom walls, and an inner side wall, the top and bottom walls having an interior guide means formed therein.

5. The injector/ejector mechanism of claim 1 wherein the grabbing member of the second handle segment comprises a rectangular planar surface normal to the extension member and having angularly depending sides extending from the extension member to the planar surface.

6. The injector/ejector mechanism of claim 5 wherein the rectangular planar surface of the grabbing member further comprises grooved sidewalls adjacent to the periphery on opposing sides of the planar surface forming a depression having open ends.

7. The injector/ejector mechanism of claim 6 wherein the injector/ejector mechanism further comprises a means for ganging together adjacent injector/ejector mechanisms for cooperative rotational movement.

8. The injector/ejector mechanism of claim 1 wherein the extension member further comprises opposing shouldered sidewalls having a slot formed therebetween, the shouldered sidewalls being normal to and integrally formed with the grabbing member.

9. The injector/ejector mechanism of claim 8 wherein the extension member further comprises a retaining pin affixed to the shoulders formed in the sidewalls of the extension member for slidably engaging interior guide means formed in the passage of the first handle member for limiting the movement of the second handle member with respect to the first handle member.

10. In a circuit board plug-in module for use in a card cage mainframe, an injector/ejector mechanism rotatably connected to the plug-in module and having a handle integrally formed with a bearing end for engaging injector and ejector surfaces on the mainframe for urging the plug-in module into and out of the mainframe during rotational movements of the mechanism, the improvement in the injector/ejector mechanism comprising:
    a first handle segment having a bearing end and a passage formed within the segment extending outwardly from the front panel opposite the bearing end; and
    a second handle segment having a gripping member normal to an extension member, the extension member slidably mating with the passage in the first handle segment, the second handle segment movable with respect to the first handle segment from a first position wherein the extension member is within the passage to a second position wherein a portion of the extension member is exposed outside the passage providing additional mechanical advantage at the bearing end when pressure is applied to the gripping member for urging the circuit board module into and out of the mainframe during rotation of the injector/ejector mechanism.

11. The injector/ejector mechanism of claim 10 wherein the first handle segment further comprises a rectilinear body having top, bottom and side surfaces with the bearing end integrally formed on and extending away from one of the side surfaces and passages formed on the side surfaces normal to the surface having the bearing end.

12. The injector/ejector mechanism of claim 11 wherein each passage on the side surfaces of the rectilinear body comprises a channel having top and bottom walls, and an inner side wall, the top and bottom walls having an interior guide means formed therein.

13. The injector/ejector mechanism of claim 10 wherein the grabbing member of the second handle segment comprises a rectangular planar surface normal to the extension member and having angularly depending sides extending from the extension member to the planar surface.

14. The injector/ejector mechanism of claim 13 wherein the rectangular planar surface of the grabbing member further comprises grooved sidewalls adjacent to the periphery on opposing sides of the planar surface forming a depression having open ends.

15. The injector/ejector mechanism of claim 14 wherein the injector/ejector mechanism further comprises a means for ganging together adjacent injector/ejector mechanisms for cooperative rotational movement.

16. The injector/ejector mechanism of claim 10 wherein the extension member further comprises opposing shouldered sidewalls having a slot formed therebetween, the shouldered sidewalls being normal to and integrally formed with the grabbing member.

17. The injector/ejector mechanism of claim 16 wherein the extension member further comprises a retaining pin affixed to the shoulders formed in the sidewalls of the extension member for slidably engaging interior guide means formed in the passage of the first handle member for limiting the movement of the second handle member with respect to the first handle member.

18. An injector/ejector mechanism for urging a circuit board plug-in module into and out of a card cage mainframe comprising:

a first handle segment rotatably connected to a front panel of the plug-in module, the first handle segment having a rectilinear body with top, bottom and side surfaces and an injector surface and an ejector surface integrally formed on and extending away from one of the side surfaces, and channels formed on the side surfaces normal to the side surface with the injector and ejector surfaces, the channels having top and bottom walls, and an inner sidewall with slots formed in the top and bottom walls, the injector and ejector surfaces integrally formed on the first handle segment respectively engaging coextensive injector and ejector surfaces on the mainframe during rotation movements of the injector/ejector mechanism; and a second handle segment having a gripping member normal to an extension member, the gripping member having angularly depending sides extending to a rectangular planar surface normal to the extension member, the extension member having opposing shouldered sidewalls with a slot formed there between, the shouldered sidewalls being normal to and integrally formed with the grabbing member, the shoulders on the sidewalls of the second handle segment slidably mating with the channels in the first handle segment providing movement of the second handle member with respect to the first handle member from a first position wherein the shoulders on the sidewalls of the second handle member are within the channels of the first handle member to a second position wherein a portion of the shoulders on the sidewalls of the second handle member are exposed outside the channels of the first handle member providing additional mechanical advantage at the injector and ejector surfaces on the first handle segment when pressure is applied to the grabbing member of the second handle segment for urging the circuit board module into and out of the mainframe during rotation of the injector/ejector mechanism.

* * * * *